(12) United States Patent
Niimi et al.

(10) Patent No.: US 9,397,100 B2
(45) Date of Patent: Jul. 19, 2016

(54) HYBRID HIGH-K FIRST AND HIGH-K LAST REPLACEMENT GATE PROCESS

(71) Applicant: Texas Instruments Incorporated, Dallas, TX (US)

(72) Inventors: Hiroaki Niimi, Dallas, TX (US); Manoj Mehrotra, Bangalore (IN); Mahalingam Nandakumar, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/578,732

(22) Filed: Dec. 22, 2014

(65) Prior Publication Data

US 2015/0187771 A1 Jul. 2, 2015

Related U.S. Application Data

(60) Provisional application No. 61/921,495, filed on Dec. 29, 2013.

(51) Int. Cl.

| | |
|---|---|
| *H01L 21/02* | (2006.01) |
| *H01L 21/027* | (2006.01) |
| *H01L 21/28* | (2006.01) |
| *H01L 21/3105* | (2006.01) |
| *H01L 21/311* | (2006.01) |
| *H01L 21/321* | (2006.01) |

(Continued)

(52) U.S. Cl.
CPC ........ *H01L 27/0922* (2013.01); *H01L 21/0271* (2013.01); *H01L 21/02164* (2013.01); *H01L 21/02178* (2013.01); *H01L 21/02181* (2013.01); *H01L 21/02186* (2013.01); *H01L 21/02189* (2013.01); *H01L 21/28079* (2013.01); *H01L 21/28088* (2013.01); *H01L 21/28158* (2013.01); *H01L 21/31053* (2013.01); *H01L 21/31055* (2013.01); *H01L 21/31111* (2013.01); *H01L 21/3212* (2013.01); *H01L 21/32133* (2013.01); *H01L 21/823828* (2013.01); *H01L 21/823842* (2013.01); *H01L 21/823857* (2013.01); *H01L 29/42364* (2013.01); *H01L 29/42372* (2013.01); *H01L 29/495* (2013.01);

(Continued)

(58) Field of Classification Search
CPC ................. H01L 27/0922; H01L 21/02164; H01L 21/02178; H01L 21/02181; H01L 21/02186; H01L 21/02189; H01L 21/0271; H01L 21/28079; H01L 21/28088; H01L 21/28158; H01L 21/31053; H01L 21/31055; H01L 21/311

See application file for complete search history.

(56) References Cited

U.S. PATENT DOCUMENTS

| | | | | |
|---|---|---|---|---|
| 6,686,292 B1 * | 2/2004 | Yang | .................. | H01L 21/3065 257/E21.218 |
| 8,835,294 B2 * | 9/2014 | Chew | ................ | H01L 21/02697 257/330 |

(Continued)

OTHER PUBLICATIONS

Nilufa Rahim. TiN/HfO2/SiO2/Si gate stacks reliability: contribution of HfO2 and interfacial SiO2 layer. department of Electrical and Computer Engineering, Jan. 2011, p. 1, 6-7, 30, 54, 58, 86.

(Continued)

*Primary Examiner* — Yasser A Abdelaziez
*Assistant Examiner* — Farun Lu
(74) *Attorney, Agent, or Firm* — Jacqueline J. Garner; Frank D. Cimino

(57) ABSTRACT

An integrated circuit and method with a metal gate NMOS transistor with a high-k first gate dielectric on a high quality thermally grown interface dielectric and with a metal gate PMOS transistor with a high-k last gate dielectric on a chemically grown interface dielectric.

5 Claims, 7 Drawing Sheets

(51) Int. Cl.

| | | |
|---|---|---|
| *H01L 21/8238* | (2006.01) | |
| *H01L 29/423* | (2006.01) | |
| *H01L 29/49* | (2006.01) | |
| *H01L 29/66* | (2006.01) | |
| *H01L 29/51* | (2006.01) | |
| *H01L 27/092* | (2006.01) | |
| *H01L 21/3213* | (2006.01) | |

(52) U.S. Cl.
CPC .... *H01L 29/66545* (2013.01); *H01L 21/28202* (2013.01); *H01L 21/28238* (2013.01); *H01L 29/4966* (2013.01); *H01L 29/513* (2013.01); *H01L 29/517* (2013.01)

(56) References Cited

U.S. PATENT DOCUMENTS

| | | | |
|---|---|---|---|
| 9,129,985 B2* | 9/2015 | Tsao | H01L 29/66545 |
| 2011/0156154 A1 | 6/2011 | Hoentschel et al. | |
| 2012/0001266 A1 | 1/2012 | Lim et al. | |
| 2014/0252487 A1* | 9/2014 | Stephens | H01L 21/28026 |
| | | | 257/368 |

OTHER PUBLICATIONS

Huang AnPing et al. Interface dipole engineering in metal gate/high-k stacks. chin Sei Bull, Aug. 2012 vol. 57 No. 22, p. 5, 6.

* cited by examiner

HYBRID HIGH-K FIRST AND HIGH-K LAST REPLACEMENT GATE PROCESS

CROSS-REFERENCE TO RELATED APPLICATIONS

This application claims the benefit of priority under U.S.C. §119(e) of U.S. Provisional Application 61/921,495 (filed Dec. 29, 2013), the contents of which are hereby incorporated by reference.

FIELD OF INVENTION

This invention relates to the field of integrated circuits. More particularly, this invention relates to replacement gate transistors in integrated circuits.

BACKGROUND

As the geometries for integrated circuits have scaled to smaller and smaller dimensions, it has become necessary to replace polysilicon transistor gates with metal gates to enable scaling to continue to smaller dimensions. When voltage is applied to a polysilicon gate, the polysilicon grains next to the gate dielectric become depleted of carriers increasing the electrical thickness of the gate dielectric and exacerbating short channel effects. Metal gates do not deplete when voltage is applied to the metal gate.

Because the work function of p-channel metal-oxide-semiconductor (PMOS) metal gates usually changes when the metal gate is subjected to high temperatures such as is required to activate dopants, replacement gate processes have been developed to circumvent the PMOS work function problem. In a replacement gate process, transistors are typically first built in the usual manner using polysilicon gates with silicon dioxide gate dielectric. The polysilion gates and gate dielectric are then removed and replaced with high-k gate dielectric and metal gates. A thin silicon dioxide dielectric is grown on the single crystal silicon transistor channel prior to deposition of the high-k gate dielectric. Because silicide is on the wafer when the thin silicon dioxide is grown, the temperature at which this thin silicon dioxide may be grown is limited. Consequently the thin silicon dioxide dielectric is typically grown chemically using SC1 ($NH_4OH+H_2O_2$). The quality of the silicon dioxide dielectric chemically grown may be marginal.

SUMMARY

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit and method has a metal gate NMOS transistor with a high-k first gate dielectric on a high quality thermally grown interface dielectric and has a metal gate PMOS transistor with a high-k last gate dielectric on a chemically grown interface dielectric.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

In a typical replacement metal gate transistor flow, NMOS and PMOS transistors with conventional polysilicon gates are formed as usual through the silicidation of the source and drains. A premetal dielectric (PMD) is then deposited over these transistors and planarized exposing the tops of the polysilicon gates. The gates and gate dielectric is then typically removed and replaced with high-k dielectric and with NMOS metal gate material with the appropriate NMOS workfunction and PMOS metal gate material with the appropriate PMOS metal gate workfunction. When the high-k dielectric and the metal gates are deposited after the polysilicon is removed, the process is termed a high-k last, metal gate last process flow.

In the embodiment described below, the polysilicon gates are formed on high-k dielectric and this high-k dielectric remains in place when the NMOS metal gate material is deposited. The term "high-k first" dielectric indicates the high-k dielectric is deposited before the poly gate transistors are formed.

Figure 1A:
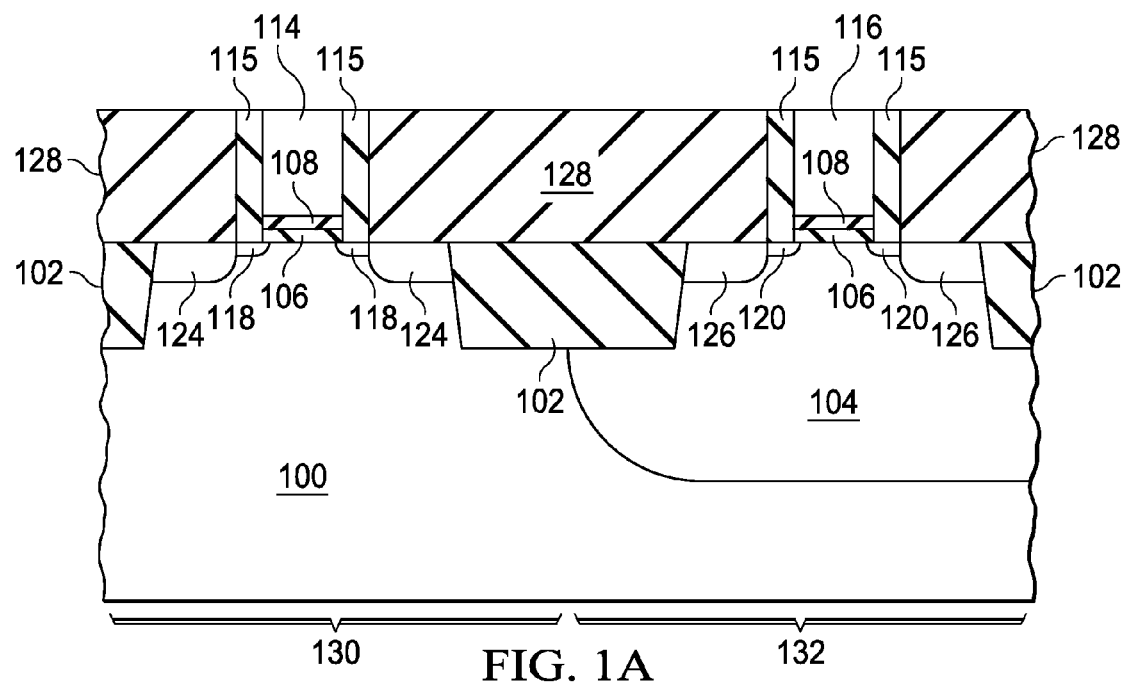
FIGS. 1A-1H are illustrations of steps in the fabrication of integrated circuits formed according to principles of the invention.
Figure 1B:
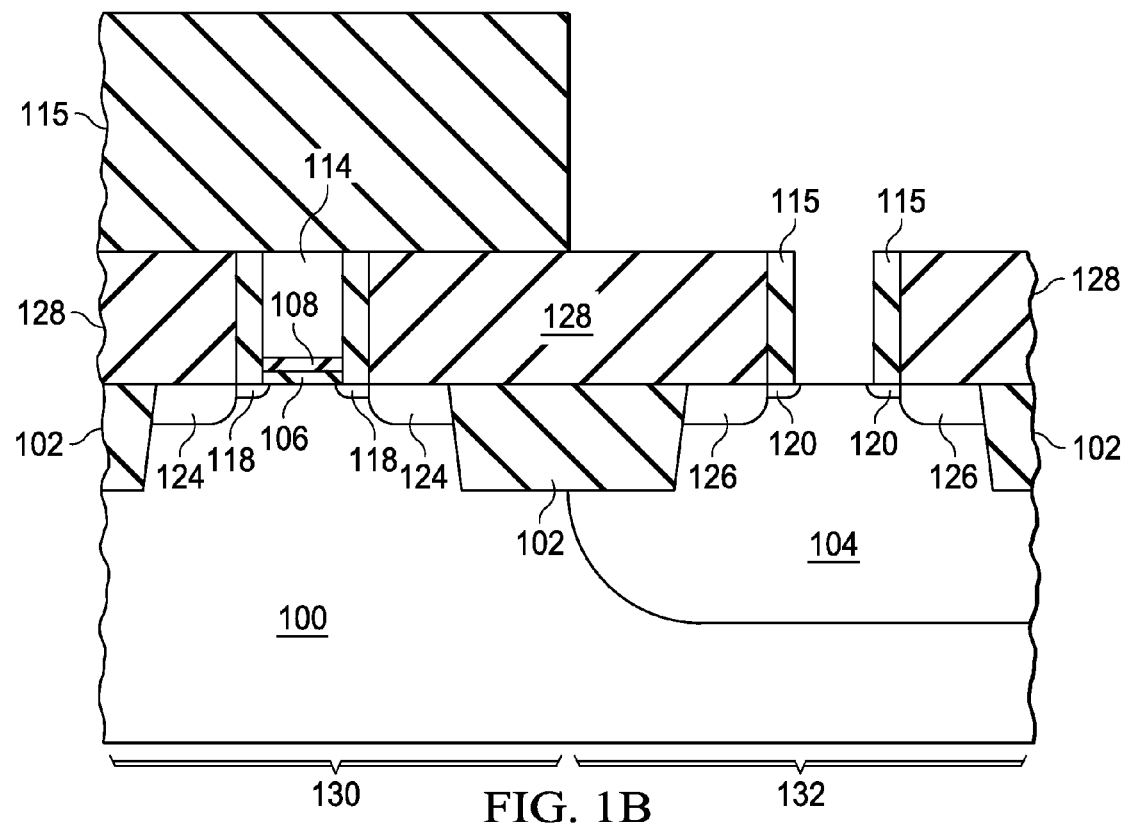
Figure 1C:
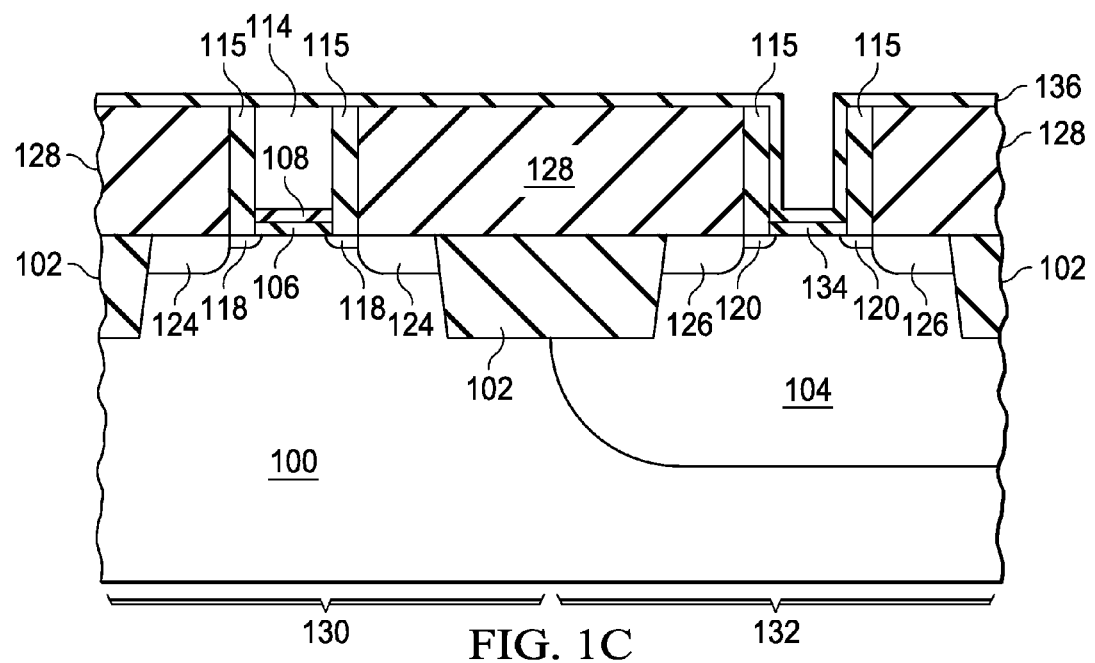
Figure 1D:
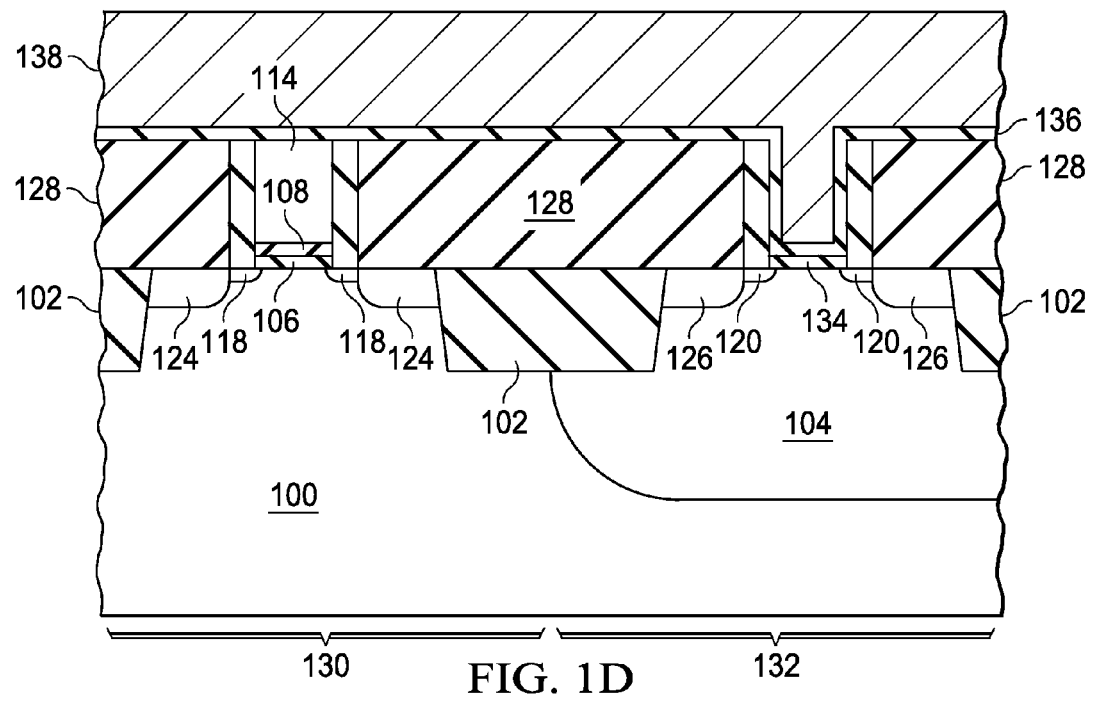
Figure 1E:
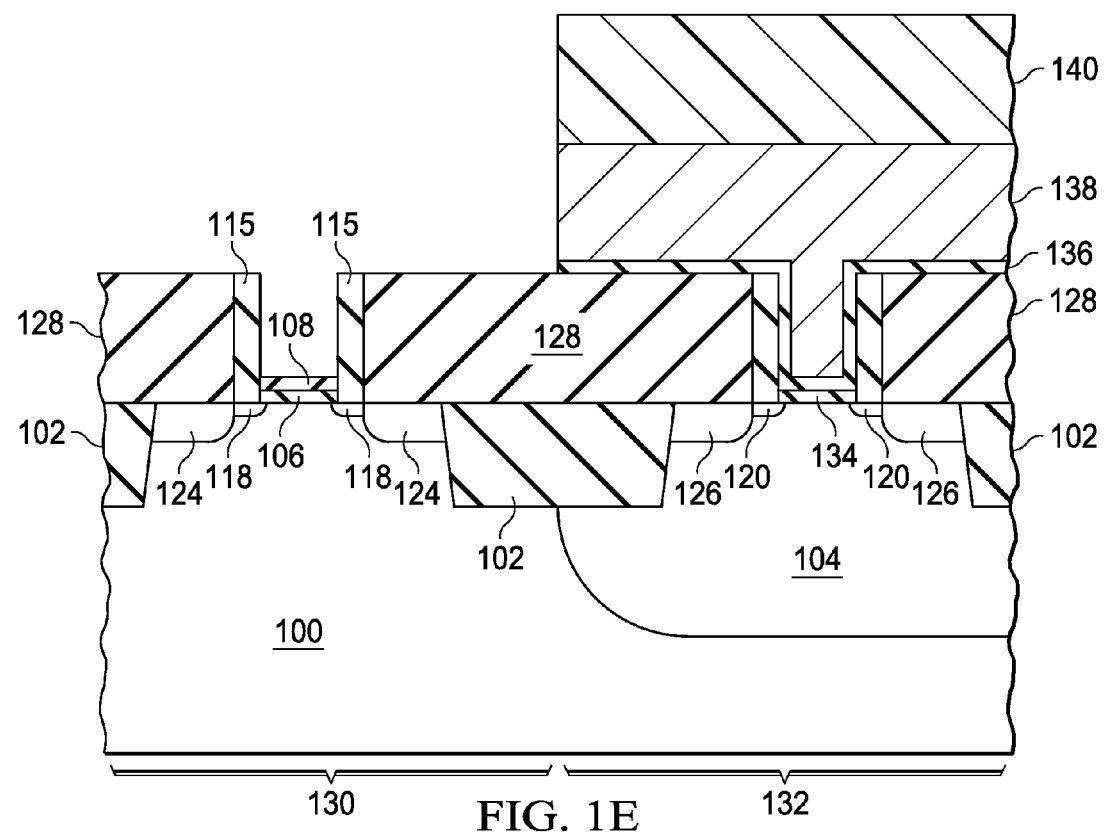
Figure 1F:
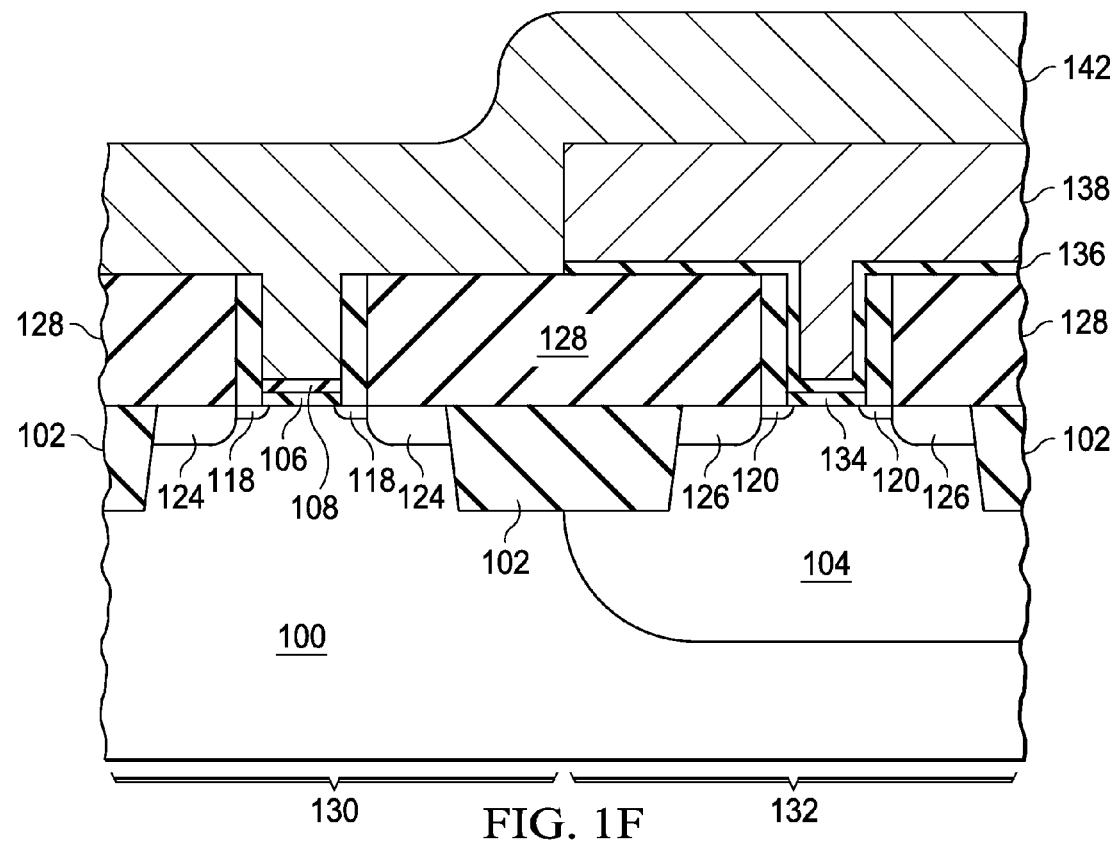
Figure 1G:
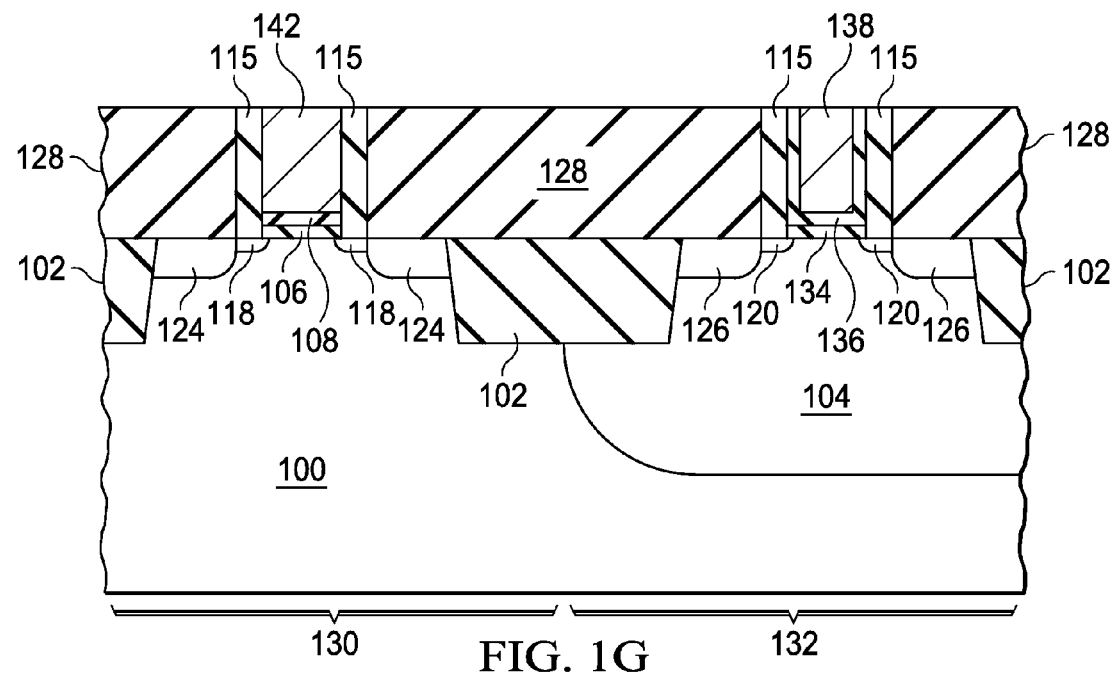
Figure 1H:
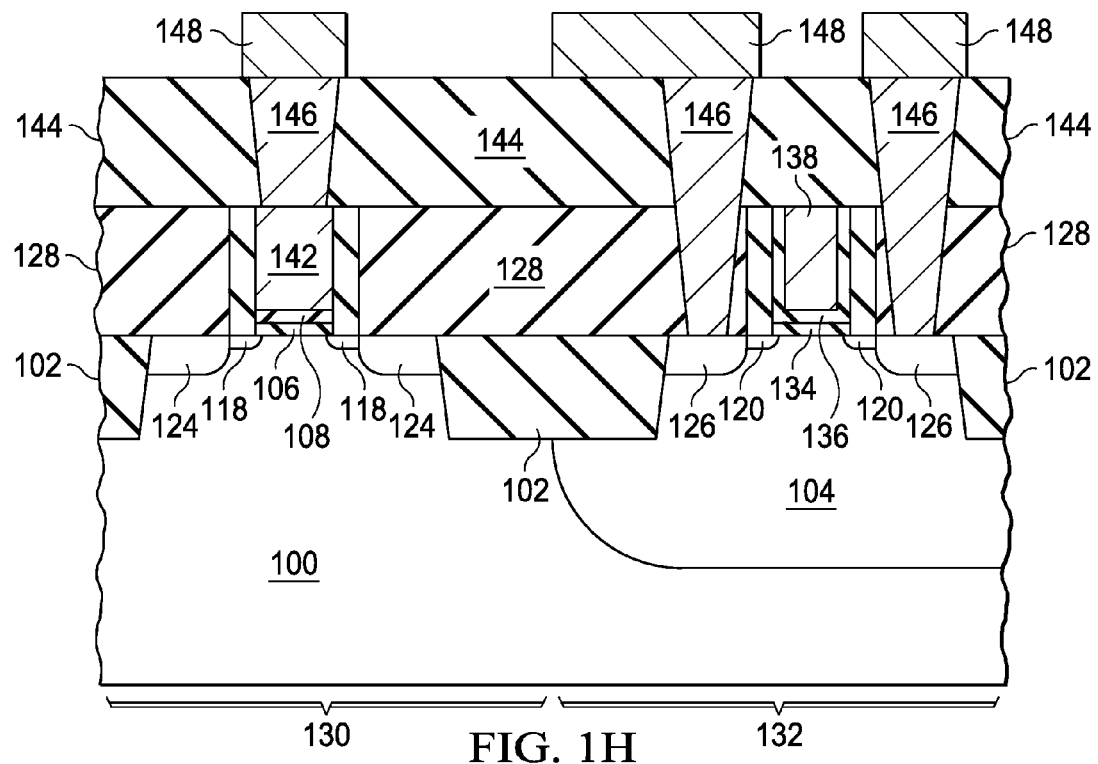

An integrated circuit formed using embodiments of the invention with an n-channel metal-oxide-semiconductor (NMOS) transistor with a gate dielectric stack comprised of a high-k first dielectric 108 deposited on a high quality gate dielectric 106 is shown in FIG. 1H. The embodiment p-channel metal-oxide-semiconductor (PMOS) transistor 132 has a gate dielectric stack comprised of a high-k last dielectric 136 deposited on a second gate dielectric 134. The embodiment process provides a high quality gate oxide 106 for the NMOS transistor 130 while also providing a desirable work function for the PMOS transistor 132. In addition, the embodiment process provides the flexibility of being able to independently optimize the high-k dielectric 108 for the NMOS and the high-k dielectric 136 for PMOS transistors. The higher quality gate dielectric on the NMOS transistor may improve carrier mobility improving transistor performance and also may reduce gate current thereby reducing standby current and prolonging battery life.

The major steps in a process flow illustrating a process for forming an integrated circuit with an NMOS transistor 130 with a high quality gate dielectric 106 and high-k first gate dielectric 108 and with a PMOS transistor 132 with high-k last gate dielectric 134 is illustrated in FIGS. 1A through 1H.

FIG. 1A is a cross section of a partially processed integrated circuit with an NMOS transistor 130 with a polysilicon replacement gate 114 and with a PMOS transistor 132 with a polysilicon replacement gate 116. The NMOS and PMOS polysilicon replacement gates 114 and 116 are formed on a high quality gate dielectric 106 such as silicon dioxide or nitrided silicon dioxide. A high-k first dielectric such as $HfO_x$, $HfSiO_x$, HfSiON, $ZrO_2$, $HfZrO_x$, $AlO_x$, and $TiO_x$ with a thickness in the range of 1 to 4 nm is deposited on the high quality thermally grown gate dielectric 106 using a process such as atomic layer deposition (ALD). (An optional sacrificial layer such as silicon dioxide may be deposited on the high-k first dielectric 108 to protect it during removal of the polysilicon replacement gate 114). N-type source and drain extensions 118 are implanted self-aligned to the NMOS polysilicon replacement gate 114. P-type source and drain extensions 120 are implanted self-aligned to the PMOS polysilicon replacement gate 116. N-type deep source and drain diffusions 124 are implanted self-aligned to the sidewalls 115 on the NMOS polysilicon replacement gate 114. P-type deep source and drain diffusions 126 are implanted self-aligned to the sidewalls 115 on the PMOS polysilicon replacement gate 116. Premetal dielectric 128 is deposited over the transistor gates 114 and 116 and planarized using chemical mechanical polish (CMP) to expose the tops of the NMOS 114 and PMOS 116 polysilicon replacement gates.

The high quality gate dielectric 106 may be $SiO_2$ grown using insitu steam oxidation (ISSG) to a thickness in the range of 0.5 to 1.5 nm and at a temperature greater than 850° C. Decoupled plasma nitridation (DPN) may be used to convert the surface of the high quality $SiO_2$ 106 to silicon oxynitride. In an example embodiment NMOS transistor with high quality thermally grown $SiO_2$, 0.8 nm ISSG oxide is grown and approximately 1.5 nm $HfO_x$ 108 is deposited on the silicon dioxide 106 using ALD.

As shown in FIG. 1B, NMOS transistor photo resist pattern 115 is formed over the NMOS transistor 130 to prevent the NMOS polysilicon replacement gate 114 from being removed. The PMOS polysilicon replacement gate 116 is removed by etching to form a PMOS replacement gate transistor trench. The high-k first gate dielectric 108 and high quality gate dielectric 108 are etched from the bottom of the PMOS replacement gate transistor trench.

Referring now to FIG. 1C, the photo resist pattern 115 is removed and a low temperature gate dielectric 134 is grown or deposited over the channel of the PMOS transistor 132. High-k last gate dielectric 136 is then deposited. The low temperature gate dielectric 134 may be $SiO_x$ grown using SC1 wet chemistry. In an example embodiment, approximately 0.6 nm $SiO_x$ is chemically grown using SC1. The high-k last dielectric may be a high-k dielectric such as $HfO_x$, $HfSiO_x$, HfSiON, $ZrO_2$, $HFZrO_x$, $AlO_x$, and $TiO_x$ in the range of about 1 to 3 nm thick. In an example embodiment approximately 1.5 nm $HfO_x$ is deposited using ALD.

As shown in FIG. 1D, PMOS metal gate material 138 is then deposited into the PMOS replacement gate trench and over the NMOS transistor 130. The PMOS metal gate material 138 may contain for example, one or more metals from the group consisting of titanium nitride, tantalum nitride, aluminum, and platinum. In an example embodiment the PMOS metal gate material 154 is about 8 nm of titanium nitride.

In FIG. 1E PMOS metal gate photo resist pattern 140 is formed on the integrated circuit to prevent the PMOS metal gate material 138 from being removed from the PMOS transistor 132. The PMOS metal gate material 138, the high-k last dielectric 136, and the NMOS polysilicon replacement gate 114 are removed from the NMOS transistor 130 forming a NMOS replacement gate transistor trench. (Prior to removal of the high-k last dielectric an optional sacrificial layer may be removed if it is present.)

Referring now to FIG. 1F the photo resist pattern 140 is removed and an NMOS transistor metal gate material 142 is deposited into the NMOS transistor replacement gate trench. The NMOS metal gate material 142 may contain for example, one or more metals from the group consisting of titanium, aluminum, titanium-aluminum alloy, and tungsten. In an example embodiment the NMOS metal gate material 142 is about 3 nm of titanium-aluminum alloy.

CMP is used to remove the NMOS metal gate material 142 overfill and the PMOS metal gate material 138 overfill from the surface of the premetal dielectric 128 as shown in FIG. 1G.

As shown in FIG. 1H, a premetal dielectric layer (PMD) 144 may be deposited and contact plugs 146 may be formed through the PMD 144 layer and through the premetal dielectric layer 128 to affect electrical connection between the deep source and drain diffusions, 124 and 126, and the first layer of interconnect 148. Additional layers of dielectric and interconnect electrically connected by vias may be formed over the first layer of interconnect 148 to complete the integrated circuit.

Figure 2A:
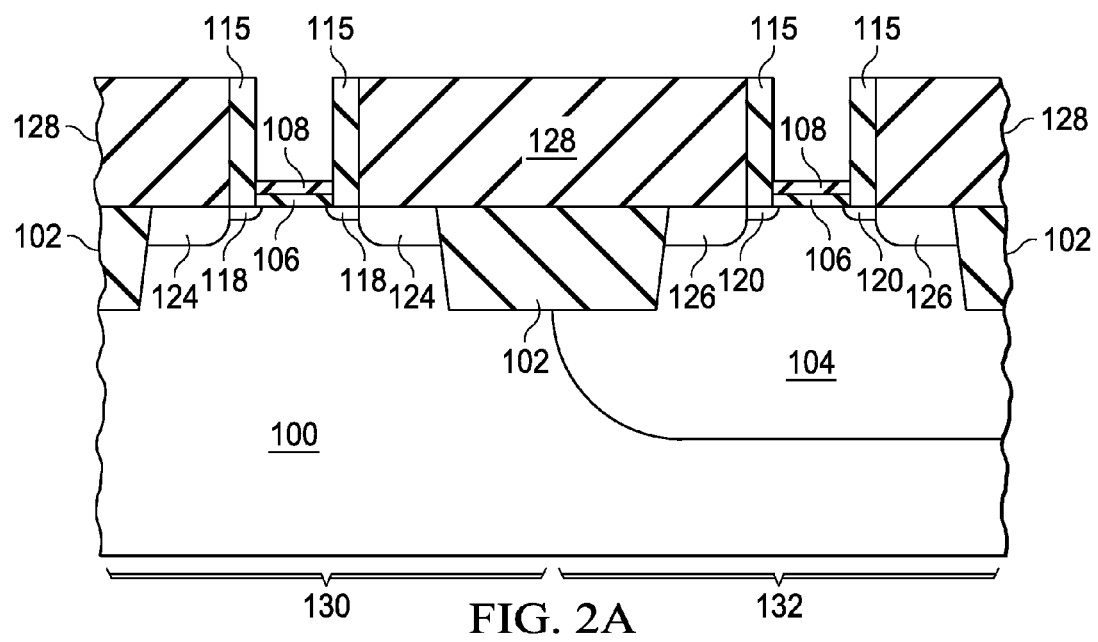
FIGS. 2A-2E are illustrations of steps in the fabrication of integrated circuits formed according to principles of the invention.

An alternative embodiment for forming high-k first gate dielectric 108 on high quality interfacial dielectric 106 on the NMOS transistor 130 and high-k last gate dielectric 134 on a chemically grown interfacial dielectric 134 on the PMOS transistor 132 is illustrated in FIGS. 2A through 2F. In this embodiment the process steps prior to FIG. 2A are the same as the process steps up to and including FIG. 1A.

As shown in FIG. 2A, following the process step described in FIG. 1A, the polysilicon replacement gates, 114 and 116, are removed. The high-k first gate dielectric 108 in an example embodiment is $HfO_x$ with a thickness in the range of 1 nm to 3 nm deposited using ALD and high quality gate dielectric 106 is silicon dioxide grown to a thickness in the range of 0.5 to 1.5 nm at a temperature greater than 850° C. using ISSG.

Figure 2B:
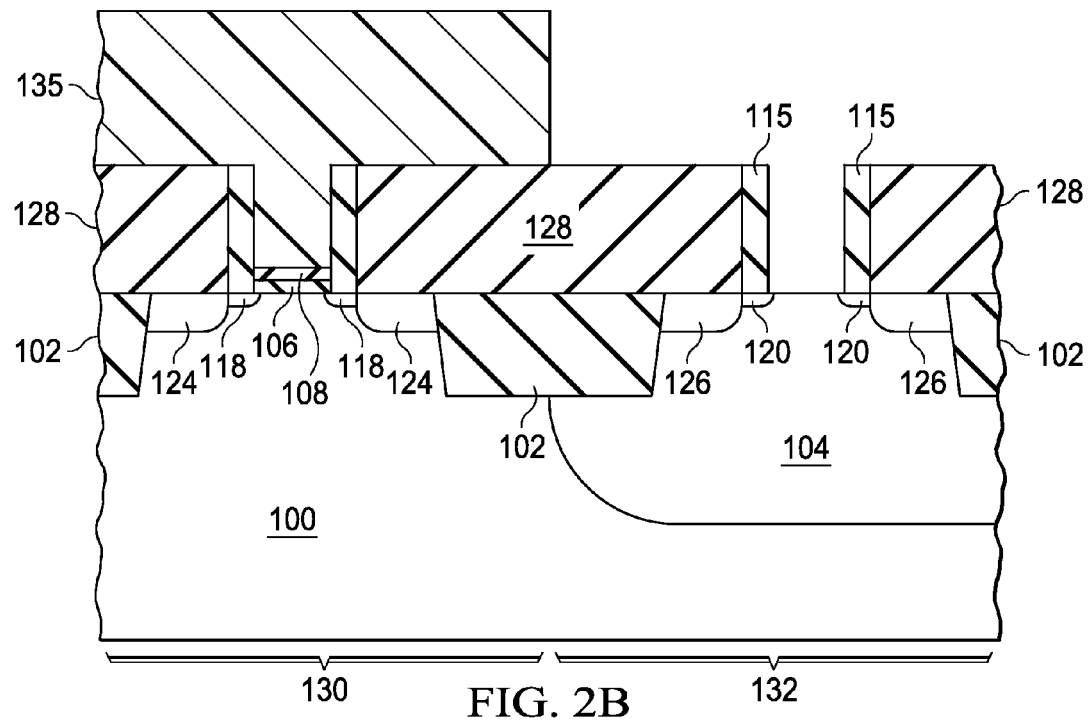

In FIG. 2B, an NMOS transistor photo resist pattern 135 is formed on the integrated circuit with a pattern over the NMOS transistor area 130 to prevent the high-k first gate dielectric 108 and the high quality gate dielectric 106 from being removed from the NMOS transistor 130. An etch with high selectivity to single crystal silicon is used to remove the high-k first gate dielectric 108 and high quality gate dielectric 106 from the bottom of the PMOS transistor replacement gate trench.

Figure 2C:
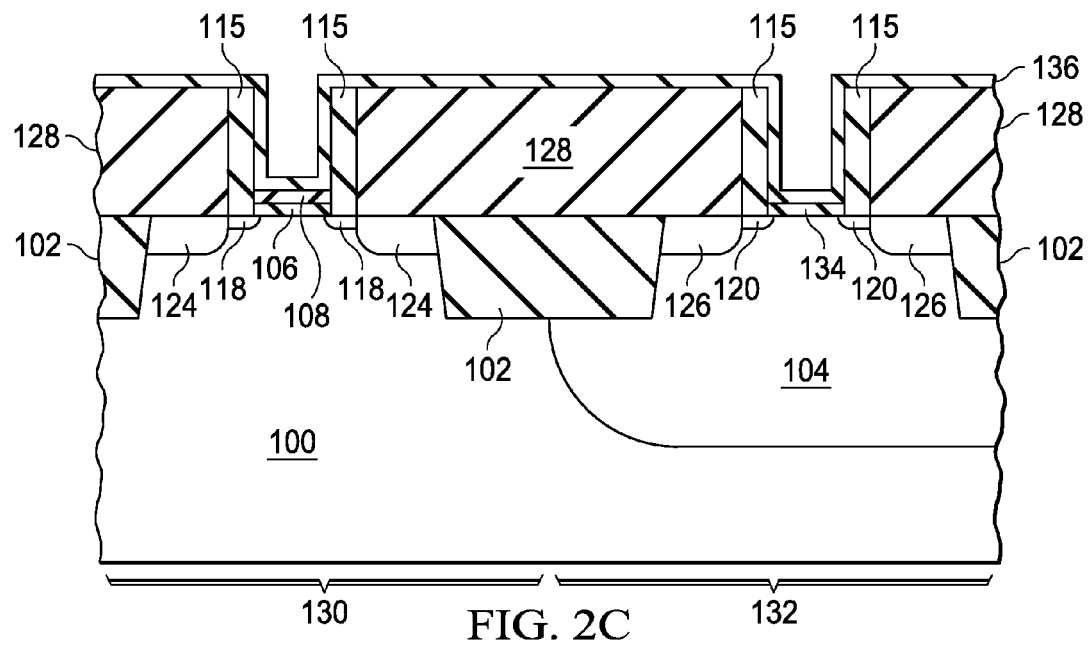

Referring now to FIG. 2C, the photo resist pattern 135 is removed and a low temperature gate dielectric 134 is grown or deposited over the channel in the bottom of the PMOS transistor 132 replacement gate trench. High-k last gate dielectric 136 is then deposited. The high-k last gate dielectric 136 in this embodiment must be able to be removed with high selectivity from the high-k first gate dielectric 108. The gate oxide dielectric 134 may be grown using SC1 wet chemistry. In an example embodiment, approximately 0.6 nm gate oxide 134 is chemically grown using SC1. The high-k last gate dielectric may be a high-k dielectric such as $HfO_x$, $HfSiO_x$, HfSiON, $ZrO_2$, $HFZrO_x$, $AlO_x$, and $TiO_x$ in the range of about 1 to 2 nm thick. In an example embodiment the high-k last gate dielectric 136 is HfSiON with a silicon content of about 40% and a thickness in the range of about 1 nm to 3 nm deposited using ALD. In another example embodiment the high-k last gate dielectric 137 is $ZrO_2$ with a thickness in the range of about 1 nm to 2 nm deposited using ALD.

Figure 2D:
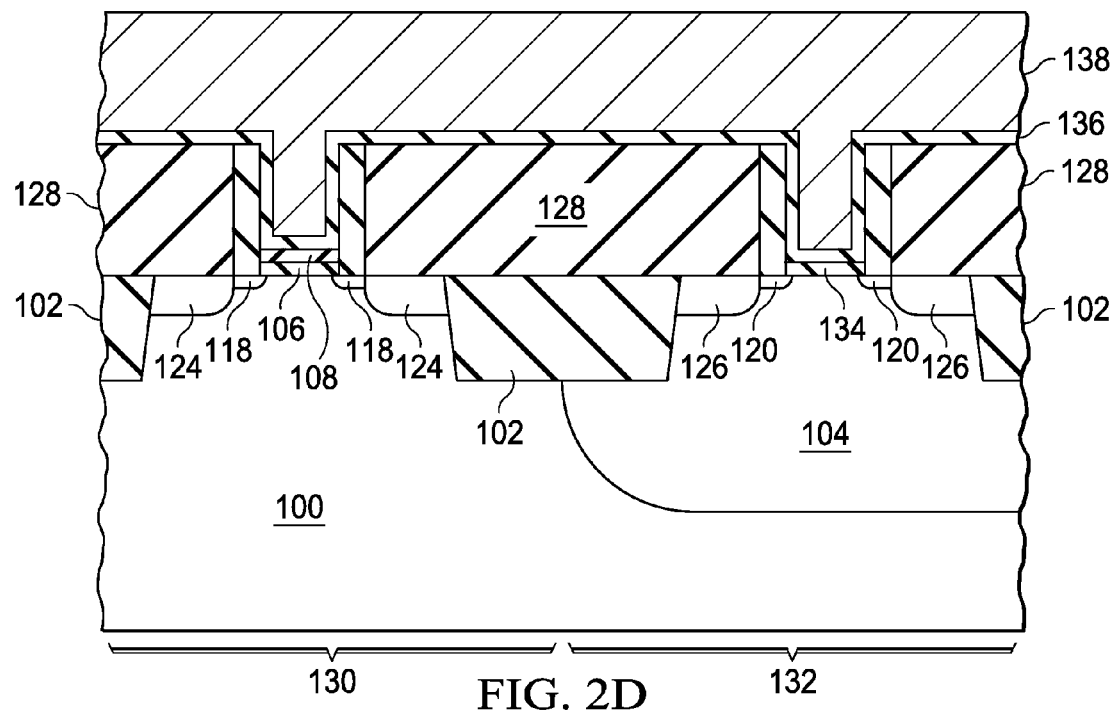

As shown in FIG. 2D, PMOS metal gate material 138 is then deposited into the NMOS and PMOS transistor replacement gate trenches. The PMOS metal gate material 138 may contain for example, one or more metals from the group consisting of titanium nitride, tantalum nitride, aluminum, and platinum. In an example embodiment the PMOS metal gate material 138 is about 8 nm of titanium nitride.

Figure 2E:
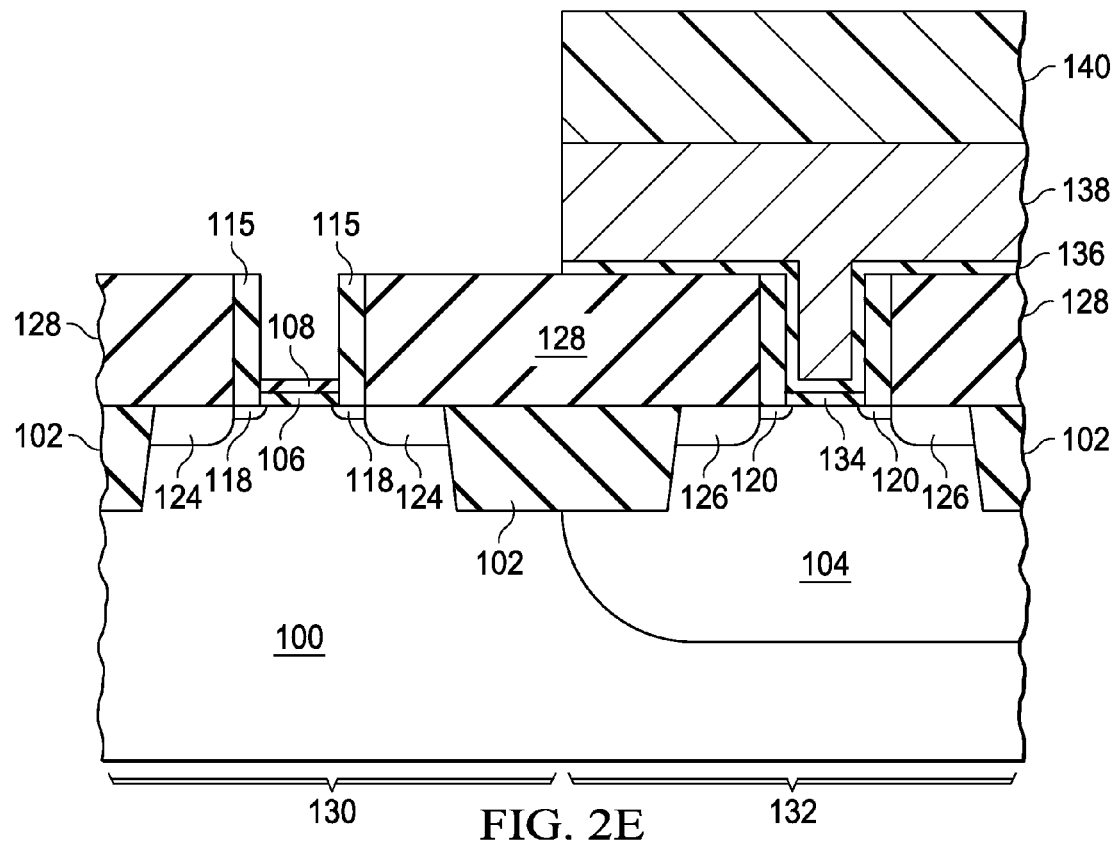

In FIG. 2E PMOS metal gate photo resist pattern 140 is formed on the integrated circuit to prevent the PMOS metal gate material 138 from being removed from the PMOS transistor 132. The PMOS metal gate material 138 and the high-k last dielectric 136 are removed from the NMOS transistor 130. In an example embodiment HfSiON high-k last gate dielectric is etched off the HfO$_x$ high-k gate first dielectric using 1000:1 HF at a temperature of about 80 C. An etch selectivity for HfSiON to HfO$_x$ or for ZrO$_2$ to HfO$_x$ of about 20:1 may be attained using this etch.

In this example embodiment, subsequent processing after the step described in FIG. 2D is the same as the process described in steps illustrated in FIGS. 1F through 1H of the previous embodiment.

Those skilled in the art to which this invention relates will appreciate that many other embodiments and variations are possible within the scope of the claimed invention.

What is claimed is:

1. A process of forming an integrated circuit, comprising the steps:
    providing a partially processed wafer of the integrated circuit;
    growing a high quality first gate dielectric on the partially processed wafer at a temperature of 850° C. or greater;
    depositing a high-k first gate dielectric on the high quality first gate dielectric;
    forming an NMOS polysilicon replacement gate of a replacement gate NMOS transistor on the high-k first gate dielectric;
    forming a PMOS polysilicon replacement gate of a replacement gate PMOS transistor on the high-k first gate dielectric;
    depositing a premetal dielectric over the replacement gate NMOS transistor and over the replacement gate PMOS transistor;
    planarizing the premetal dielectric to expose a top of the PMOS polysilicon replacement gate and to expose a top of the NMOS polysilicon replacement gate;
    forming an NMOS transistor photo resist pattern wherein the NMOS transistor photo resist pattern covers the NMOS polysilicon replacement gate and exposes the PMOS polysilicon replacement gate;
    removing the PMOS polysilicon replacement gate to form a PMOS replacement gate transistor trench;
    removing the high-k first gate dielectric and removing the high quality first gate dielectric from a bottom of the PMOS replacement gate trench;
    removing the NMOS transistor photo resist pattern;
    forming a second gate dielectric layer on the integrated circuit wherein the second gate dielectric covers the bottom of the PMOS replacement gate trench;
    depositing a high-k last gate dielectric on the integrated circuit;
    depositing PMOS metal gate material on the high-k last gate dielectric;
    forming a PMOS transistor photo resist pattern wherein the PMOS photo resist pattern covers the PMOS transistor and exposes the NMOS transistor region;
    etching the PMOS metal gate material from the NMOS transistor region;
    etching the high-k last gate dielectric layer from the NMOS transistor region;
    etching the NMOS polysilicon replacement gate to form an NMOS replacement gate transistor trench;
    removing the PMOS transistor photo resist pattern;
    depositing NMOS metal gate material on the integrated circuit and into the NMOS replacement gate trench; and
    polishing the integrated circuit to remove the NMOS and the PMOS metal gate material from a surface of the premetal dielectric and to form an NMOS metal gate in the NMOS replacement gate trench and to form a PMOS metal gate in the PMOS replacement gate trench.

2. The process of claim 1, wherein the high quality first gate dielectric is silicon dioxide with a thickness in the range of 0.5 to 1.5 nm and wherein the second gate dielectric is SiO$_x$ chemically grown with SC1 to a thickness of about 0.6 nm.

3. The integrated circuit of claim 1, wherein the high-k first gate dielectric is selected from the group consisting of HfO$_x$, HfSiO$_x$, HfSiON, ZrO$_2$, HfZrO$_x$, AlO$_x$, or TiO$_x$ and wherein the high-k last gate dielectric is selected from the group consisting of HfO$_x$, HfSiO$_x$, HfSiON, ZrO$_2$, HfZrO$_x$, AlO$_x$, or TiO$_x$.

4. The integrated circuit of claim 1, wherein the NMOS metal gate material is selected from the group consisting of titanium, aluminum, titanium-aluminum alloy, and tungsten and wherein the PMOS metal gate material is selected from the group consisting of titanium nitride, tantalum nitride, aluminum, and platinum.

5. The integrated circuit of claim 1, wherein
    the high quality gate dielectric is nitrided silicon dioxide with a thickness in the range of about 0.5 to 1.5 nm;
    the high-k first gate dielectric is HfO$_x$ with a thickness in the range of about 1 to 3 nm;
    the NMOS metal gate material is titanium-aluminum alloy with a thickness of about 3 nm
    the second gate dielectric layer is chemically grown with SC1 with a thickness of about 0.6 nm
    the high-k last gate dielectric is HfO$_x$ with a thickness in the range of about 1 to 3 nm; and
    the PMOS metal gate material is titanium nitride with a thickness in the range of about 8 nm.

* * * * *